(12) United States Patent
Wang et al.

(10) Patent No.: US 11,641,763 B2
(45) Date of Patent: May 2, 2023

(54) DISPLAY PANEL AND DISPLAY DEVICE (71) Applicants: Chengdu BOE Optoelectronics Technology Co., Ltd., Sichuan (CN); BOE Technology Group Co., Ltd., Beijing (CN)

(72) Inventors: Zuojia Wang, Beijing (CN); Liqiang Chen, Beijing (CN); Jiafan Shi, Beijing (CN); Qingsong Wang, Beijing (CN); Chao Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/515,085

(22) Filed: Oct. 29, 2021

(65) Prior Publication Data

US 2022/0293697 A1 Sep. 15, 2022

(30) Foreign Application Priority Data

Mar. 9, 2021 (CN) .......................... 202110255750.3

(51) Int. Cl.
*G06F 3/041* (2006.01)
*G06F 3/044* (2006.01)
*H01L 27/32* (2006.01)
*H01L 51/56* (2006.01)

(52) U.S. Cl.
CPC ........ *H01L 27/3225* (2013.01); *G06F 3/0412* (2013.01); *G06F 3/0445* (2019.05); *H01L 27/323* (2013.01); *H01L 27/3276* (2013.01); *H01L 51/56* (2013.01); *H01L 2227/323* (2013.01)

(58) Field of Classification Search
CPC ...... G06F 3/0412; G06F 3/0445; G06F 3/045; G06F 2203/04103; G06F 2203/04112; G06F 3/044; G06F 3/041
See application file for complete search history.

(56) References Cited

U.S. PATENT DOCUMENTS

| | | | |
|---|---|---|---|
| 2017/0047361 A1* | 2/2017 | Xu | H01L 29/78678 |
| 2017/0139520 A1* | 5/2017 | Yeh | H01Q 9/30 |
| 2017/0235398 A1* | 8/2017 | Choi | H04N 5/232 345/173 |
| 2017/0285844 A1* | 10/2017 | Park | G06F 1/1647 |
| 2020/0020751 A1* | 1/2020 | Cho | H01Q 1/24 |
| 2021/0005960 A1* | 1/2021 | Kida | H01Q 7/00 |
| 2021/0019005 A1* | 1/2021 | Chen | G06F 3/047 |
| 2022/0209068 A1* | 6/2022 | So | H01L 27/156 |

* cited by examiner

Primary Examiner — Md Saiful A Siddiqui
(74) Attorney, Agent, or Firm — IPro, PLLC (57) ABSTRACT

Disclosed are a display panel and a display device. The display panel includes a first display region and a second display region, the density of pixels of the first display region is lower than the density of pixels of the second display region; the display panel includes a base substrate and a cover plate, and an antenna arranged between the base substrate and the cover plate, the antenna is arranged in the first display region and among the pixels.

12 Claims, 5 Drawing Sheets

Fig. 6 ized glass, for example.

DISPLAY PANEL AND DISPLAY DEVICE

This application claims priority to Chinese Patent Application No. 202110255750.3, filed on Mar. 9, 2021, which is hereby incorporated by reference in its entirety.

FIELD

The present application relates to the field of display, and in particular to a display panel and a display device.

BACKGROUND

With the maturity of flexible display industry and continuous innovation of application, the new terminal structure has a great influence on the traditional complete machine assembly process. For example, in the terminal products using curved screens, the large screen-to-body ratio occupies part of the area of the back cover and the middle frame, which makes the layout space of antennas less and less. Moreover, with the popularization of 5G, new products have higher demand for the number of antennas, which brings great difficulty to the assembly of the complete machine.

SUMMARY

The present disclosure discloses a display panel and a display device.

The present disclosure provides a display panel. The display panel includes a first display region and a second display region. The density of pixels of the first display region is lower than the density of pixels of the second display region. The display panel further includes a base substrate and a cover plate, and an antenna arranged between the base substrate and the cover plate. The antenna is arranged on the first display region and among the pixels.

In some embodiments, the display panel further includes a first conductive layer and a second conductive layer arranged between the base substrate and the cover plate, and an insulating layer arranged between the first conductive layer and the second conductive layer; the antenna includes first wires and second wires, the first wires are arranged on a same layer as the first conductive layer and avoid a pattern of the first conductive layer; the second wires are arranged on a same layer as the second conductive layer and avoid a pattern of the second conductive layer; and the first wires are electrically connected to the second wires through via-holes passing through the insulating layer.

In some embodiments, the first conductive layer is a gate layer including a pattern of gate lines; and the first wires extend in an extending direction of the gate lines.

In some embodiments, the second conductive layer is a source drain layer including a pattern of data lines; and the second wires extend along an extending direction of the data lines.

In some embodiments, the first conductive layer is a first touch electrode layer including a pattern of first touch electrodes; and the first wires extend along an extending direction of the first touch electrodes.

In some embodiments, the second conductive layer is a second touch electrode layer including a pattern of second touch electrodes; and the second wires extend along an extending direction of the second touch electrodes.

In some embodiments, the display panel further includes a cathode layer arranged between the antenna and the cover plate; and the cathode layer is provided with a first opening which is arranged in the first display region and is configured to expose at least part of the antenna.

In some embodiments, the shape of the first opening is the same as the shape of the antenna, and the projection of the antenna on a plane where the cathode layer is located is within the first opening.

In some embodiments, the display panel further includes a touch electrode layer arranged between the antenna and the cover plate; and in the first display region, an electrode pattern of the touch electrode layer is configured to avoid a pattern of the antenna.

In some embodiments, the projection of the antenna on the base substrate is rectangular spiral.

In some embodiments, the density of pixels of the first display region is $3/10$-$7/10$ of the density of pixels of the second display region.

In some embodiments, the first display region is a curved display region and the second display region is a planar display region.

In some embodiments, the first display region includes two portions which are arranged on two opposite sides of the second display region.

In some embodiments, the second display region includes two portions which are arranged in parallel on two opposite sides of the first display region.

A display device, including the display panel according to any of the above.

DETAILED DESCRIPTION OF THE EMBODIMENTS

The technical solutions in embodiments of the present disclosure will be clearly and fully described below with reference to the accompanying drawings in embodiments of the present disclosure, and it will be apparent that the described embodiments are only some, but not all, embodiments of the present disclosure. Based on the embodiments in the present disclosure, all other embodiments obtained by those of ordinary skill in the art without inventive step are intended to be within the scope of protection of the present disclosure.

Figure 1:
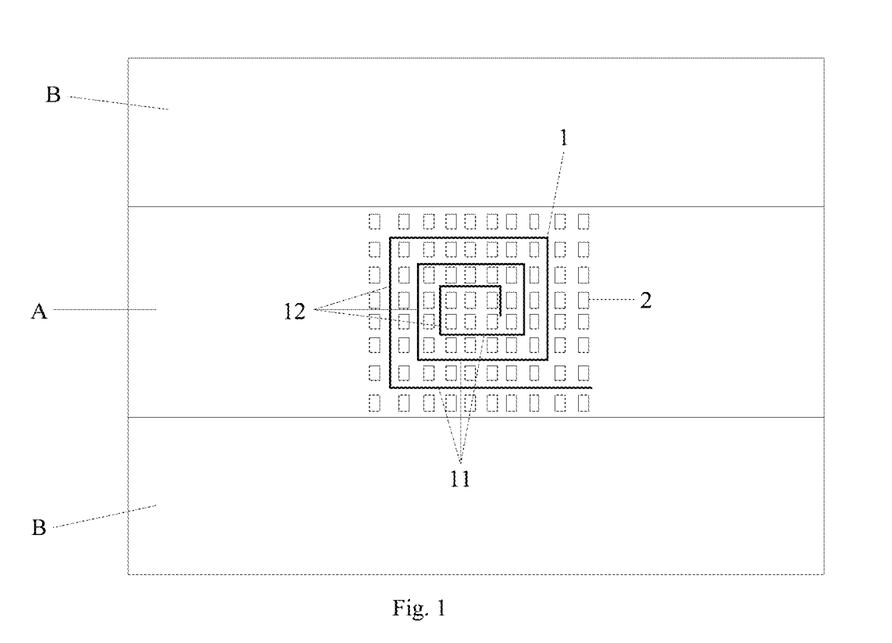
FIG. 1 is a structural diagram of a display panel according to an embodiment of the present disclosure.
Figure 2:
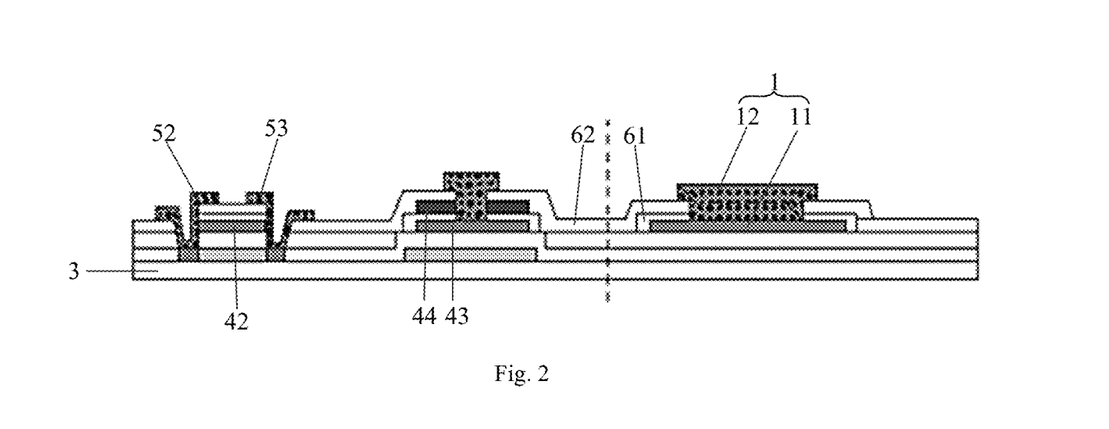
FIG. 2 is a structural diagram of a partial area cross-section of a display panel according to an embodiment of the present disclosure.

As shown in FIG. 1 and FIG. 2, an embodiment of the present disclosure provides a display panel including a first display region A and a second display region B. The density of pixels 2 of the first display region A is lower than the density of pixels 2 of the second display region B.

The display panel includes a base substrate 3 and a cover plate (not shown in the figure), and an antenna 1 arranged between the base substrate 3 and the cover plate. The antenna 1 is arranged in the first display region A and among the pixels 2.

The display panel provided by the present disclosure integrates the antenna 1 within the display region of the screen, specifically, the density of pixels 2 of the first display region A is reduced and the antenna 1 is arranged among the pixels 2 of the first display region A. In this way, the process of antenna assembling for end products is removed and terminal space occupation by conventional antenna arrangement is reduced, the complete machine components can be reduced on the one hand, the product structure can be lightened and thinned, and the complete machine assembly process can be simplified on the other hand, and assembly yield can be efficiently improved. Therefore, the display panel provided by the present disclosure can effectively solve the problem of difficult antenna arrangement of a new terminal product.

In particular, the 'pixel' described in embodiments herein includes at least an opening portion of the pixel, may also include a pixel circuit portion. 'Among the pixels' then refers to the area among the openings of the adjacent pixels.

In some embodiments, as shown in FIG. 1 and FIG. 2, the display panel provided by the present disclosure further includes a first conductive layer and a second conductive layer arranged between the base substrate and the cover plate, and an insulating layer arranged between the first conductive layer and the second conductive layer.

In some embodiments, the antenna 1 includes first wires 11 and second wires 12, the first wires 11 are arranged on a same layer as the first conductive layer and avoid a pattern of the first conductive layer; the second wires 12 are arranged on a same layer as the second conductive layer and avoid a pattern of the second conductive layer; and the first wires 11 are electrically connected to the second wires 22 through via-holes passing through the insulating layer.

In some embodiments, the antenna 1 is divided into two portions of first wires 11 and second wires 12, and the first wires 11 and the second wires 12 are separately arranged in different conductive layers, which may effectively increase the layout space of the antenna 1, avoid the concentration of the antenna 1 in one conductive layer to have a large impact on the pattern of the conductive layer, and may reduce the requirement of the antenna 1 for the density of pixels 2 of the first display region A.

Figure 3A:
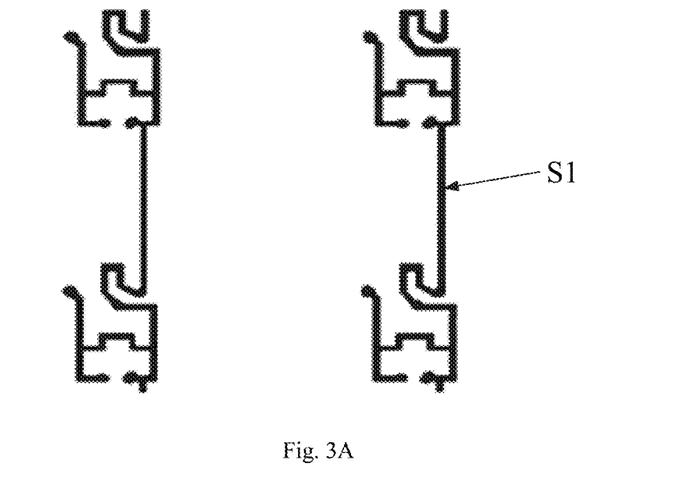
FIG. 3A is a partial structural diagram of a manufacturing process of a display panel according to an embodiment of the present disclosure.
Figure 3B:
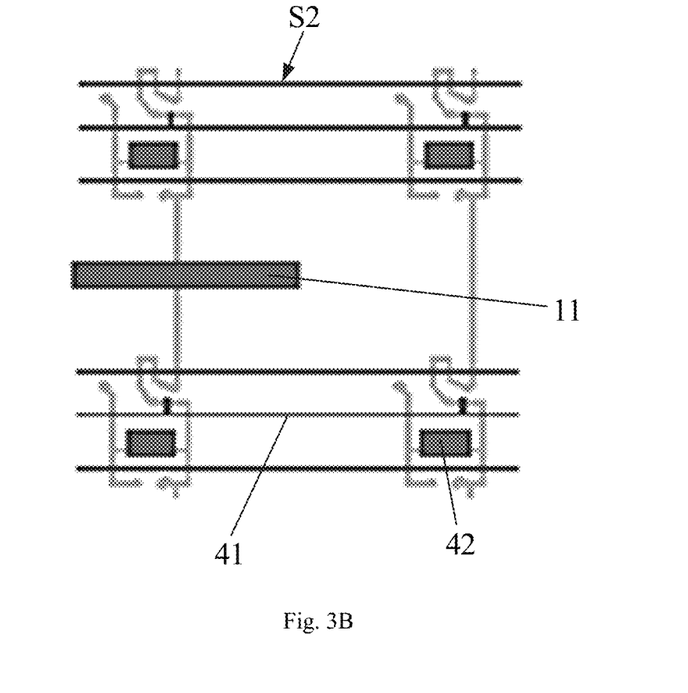
FIG. 3B is a partial structural diagram of a manufacturing process of a display panel according to an embodiment of the present disclosure.

In some embodiments, as shown in FIG. 2 and FIG. 3B, the first conductive layer is a gate layer, in particular includes a pattern of gate lines 41 and may further include a pattern of a gate 42 of a thin film transistor (TFT).

Exemplarily, the first wires 11 are arranged on a same layer as the first conductive layer, in particular extend along an extending direction of the gate lines 41, so that the first wires 11 can avoid the pattern of the first conductive layer as much as possible, and can easily avoid the pixel openings to be arranged among pixel rows.

Figure 3C:
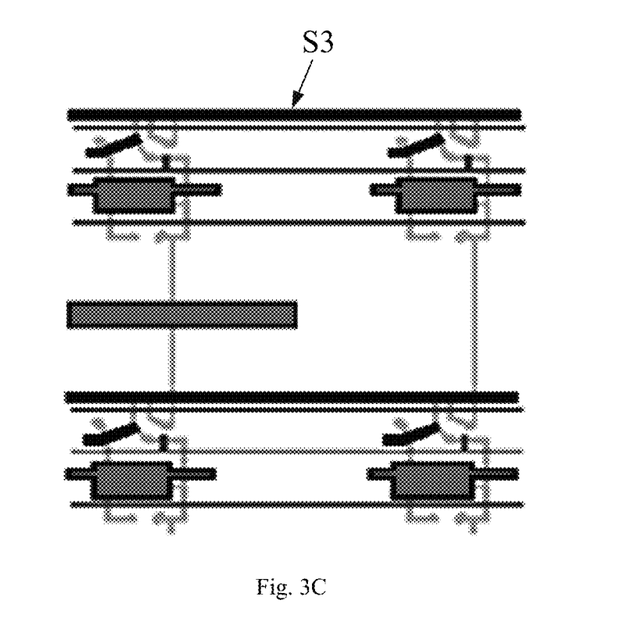
FIG. 3C is a partial structural diagram of a manufacturing process of a display panel according to an embodiment of the present disclosure.
Figure 3D:
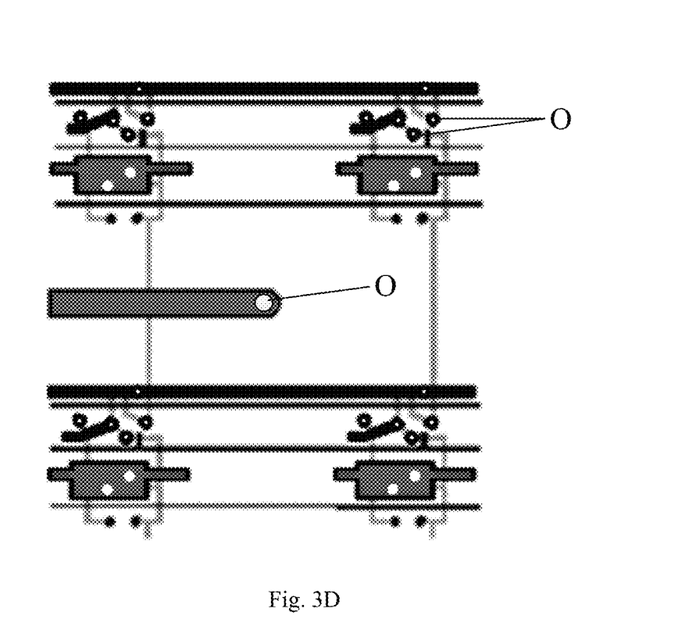
FIG. 3D is a partial structural diagram of a manufacturing process of a display panel according to an embodiment of the present disclosure.
Figure 3E:
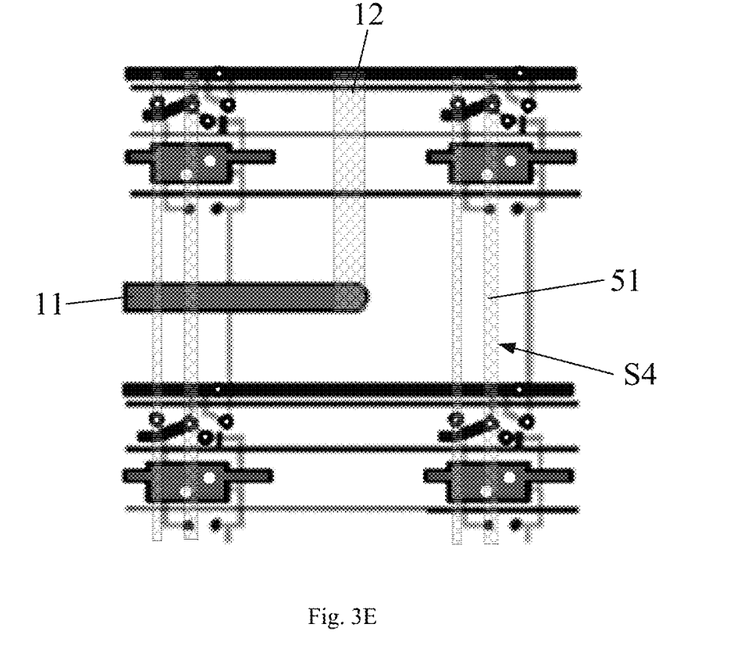
FIG. 3E is a partial structural diagram of a manufacturing process of a display panel according to an embodiment of the present disclosure.

Further, as shown in FIG. 2 and FIG. 3E, the second conductive layer is a source drain layer (SD layer) S4 including a pattern of data lines 51 and may also include a pattern of a source 52 and a drain 53 of a thin-film transistor (TFT).

Exemplarily, the second wires 12 are arranged on a same layer as the second conductive layer, in particular extend along the extension direction of the data lines 51, so that the second wires 12 can avoid the pattern of the second conductive layer as much as possible, and can easily avoid the pixel openings to be arranged among pixel columns.

Exemplarily, in the display panel according to an embodiment of the present disclosure, the gate layer includes a first gate layer S2 (including the gate 42 of the TFT and a lower electrode 43 of a memory capacitor) close to the base substrate 3 and a second gate layer S3 (including an upper electrode 44 of the memory capacitor) on a side of the first gate layer away from the base substrate 3, and the first wires 11 are arranged in the same layer as either one of the layers; for example, the first wires 11 may be arranged on the same layer as the first gate layer S2.

Further, a second gate insulating layer 61 and an interlayer insulating layer 62 are arranged between the first conductive layer and the second conductive layer. The first wires 11 and the second wires 12 are connected by punching (CNT punching) on the second gate insulating layer 61 and the interlayer insulating layer 62 to form the pattern of the antenna 1 among pixel dots.

In particular, the first wires are arranged on the same layer as the gate layer and the second wires are arranged on the same layer as the source and drain layer, the existing TFT process can be directly used to arrange the pattern of the first wires in the gate layer and arrange the pattern of the second wires in the SD layer, and the first wires and the second wires are connected by CNT punching process. The process is simple and can simplify the display panel preparation flow.

Exemplarily, in an embodiment of the present disclosure, by taking a 7T1C circuit as an example, a specific flow of a TFT process stage includes the following steps.

Step 101, referring to FIG. 3A, a pattern of an active layer S1 is formed by a patterning process on a TFT Buffer; and the active layer may employ a P—Si structure.

Step 102, referring to FIG. 3B, first gate insulating layer coating is performed on the active layer, a first metal layer is coated on the first gate insulating layer, and a pattern of the first gate layer S2 (including the gate line 41 and the TFT gate 42, and other structures) and a pattern of the first wires 11 are formed by a patterning process, and then second gate insulating layer coating is performed on the first gate layer S2.

Step 103, referring to FIG. 3C, a second gate layer S3 is formed by a patterning process on the second gate insulating layer, and then interlayer insulating layer coating is performed on the second gate layer S3.

Step 104, referring to FIG. 3D, via-holes O passing through the second gate insulating layer and the interlayer insulating layer are formed by exposure development and dry etching.

Step 105, referring to FIG. 3E, a pattern of a source drain layer S4 (including the data lines 51 and the source and drain of the TFT, and other structures.) and a pattern of the second wires 12 are formed on the interlayer insulating layer by a patterning process, and the conductive film layers are connected to form a 7T1C circuit and an antenna.

Step 106, a planar layer is finally coated on the source drain layer S4 to protect the TFT device.

In some embodiments, the first conductive layer is a first touch electrode layer including a pattern of first touch electrodes. In particular, the first touch electrode may include a plurality of first electrode blocks arranged along the first direction, and the plurality of first electrode blocks are successively connected thereamong.

Exemplarily, the first wires extend along the extending direction of the first touch electrodes (i.e. the arrangement direction of the plurality of first electrode blocks) so that the pattern of the first touch electrodes can be avoided as much as possible.

Further, the second conductive layer is a second touch electrode layer including a pattern of second touch electrodes. In particular, the second touch electrode may include a plurality of second electrode blocks arranged along the second direction, the plurality of second electrode blocks being successively connected thereamong. The second direction intersects the first direction so that a touch operation can be positioned between the two touch electrode layers.

Exemplarily, the second wires extend along the extending direction of the second touch electrodes (i.e. the arrangement direction of the plurality of second electrode blocks) so that the pattern of second touch electrodes can be avoided as much as possible.

Exemplarily, the first touch electrode layer may be an emitting electrode and the second touch electrode may be a receiving electrode; alternatively, the first touch electrode layer may be the receiving electrode and the second touch electrode may be the emitting electrode.

Exemplarily, the density of the first touch electrodes in the first display region is lower than the density of the first touch electrodes in the second display region; the density of the second touch electrodes of the first display region is lower than the density of the second touch electrodes of the second display region.

Specifically, by reducing partial touch function of the first display region or losing touch accuracy of the first display region, more layout space can be provided for the antenna, and capacitive coupling between the antenna and the touch electrodes can be avoided, thus preventing interference between the antenna and the touch electrodes.

Figure 4:
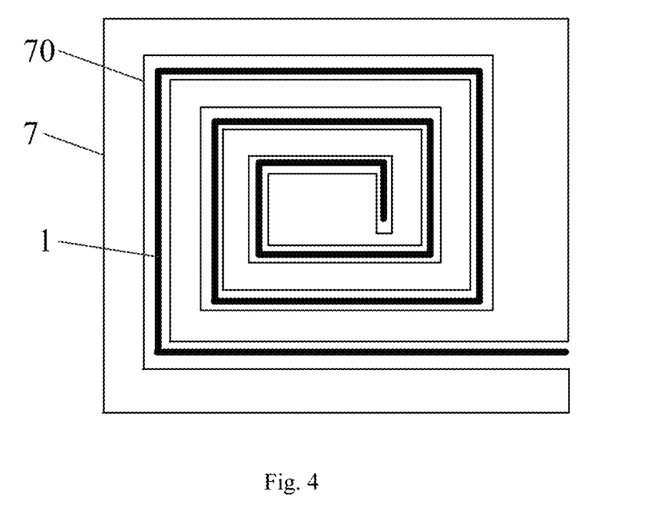
FIG. 4 is a partial structural diagram of a display panel according to another embodiment of the present disclosure.

In one particular embodiment, in the display panel provided herein, the projection of the antenna on the base substrate is a rectangular spiral. As shown in FIG. 1 and FIG. 4, the first wires 11 and the second wires 12 are alternately connected in sequence to form a spiral-shaped rectangular antenna 1.

Of course, in the display panel provided in the embodiments of the present disclosure, the antenna is not limited to the type described above, nor to the layout solution described above, and in particular, other layer structures may be used to arrange the antenna, and different types of antennas may be arranged depending on the size of the layout space; for example, a separate conductive layer may be added on an OLED encapsulation layer for disposing the antenna.

In a particular embodiment, as shown in FIG. 4, the display panel provided by the present disclosure further includes a cathode layer 7 arranged between the antenna 1 and the cover plate; the cathode layer 7 is provided with a first opening 70 which is arranged in the first display region and is configured to expose at least part of the antenna 1.

Exemplarily, the shape of the first opening 70 is the same as the shape of the antenna 1, and the projection of the antenna 1 onto the plane where the cathode layer 7 is located is within the first opening 70. In other words, the first opening 70 is configured to expose the whole antenna 1.

In particular, the opening arranged on the cathode layer prevents the influence of the cathode on the antenna signal and reduces potential risks.

In particular, the area among the pixel dots can be hollowed out by using a cathode patterning process to form first openings to expose the antenna pattern, which prevents the influence of the cathode on the antenna signal and does not affect the luminous display of the pixel dots.

Further, the display panel provided by the present disclosure includes a touch electrode layer arranged between the antenna and the cover plate; and in particular, in the first display region, the electrode pattern of the touch electrode layer is configured to avoid the pattern of the antenna.

Exemplarily, the touch electrode layer may include an emitting electrode and a receiving electrode, e.g. first and second wires of the antenna are arranged on the same layer as the gate layer and the source drain layer, respectively, the emitting electrode extends in the same direction as the first wire, and there is no overlap in projection of the emitting electrode and the first wire on the base substrate; the receiving electrode extends in the same direction as the second wire, and there is no overlap in projection of the receiving electrode and the second wire on the base substrate. In this way, the electrode pattern of the touch electrode layer can be made to avoid the pattern of the antenna as much as possible, thus reducing the influence of the touch electrode layer on the signal of the antenna.

Of course, if other conductive layers are also included in the display panel, the patterns of these conductive layers may be arranged to avoid the graphical layout area of the antenna as much as possible to reduce the effect of each conductive layer on the signal of the antenna.

In some embodiments, as shown in FIG. 1, in a display panel provided by the present disclosure, the density of pixels 2 of the first display region A is 3/10-7/10 of the density of pixels 2 of the second display region B.

Exemplarily, the density of pixels 2 of the first display region A is ½ of the density of pixels 2 of the second display region B.

In particular, in practical design, the resolution of a portion of a display region of the display panel may be suitably reduced according to line width and shape requirements on the antenna, and the portion of the display region is used as a first display region.

Figure 5:
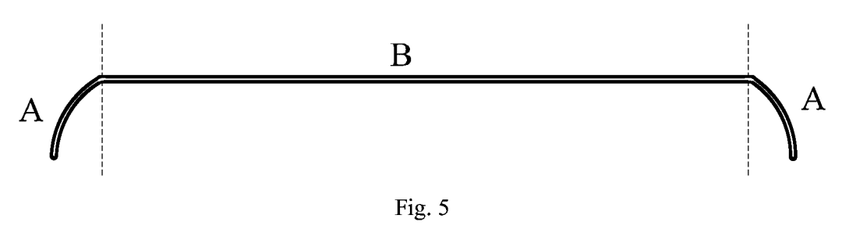
FIG. 5 is an overall cross-sectional diagram of a display panel according to an embodiment of the present disclosure.
Figure 6:
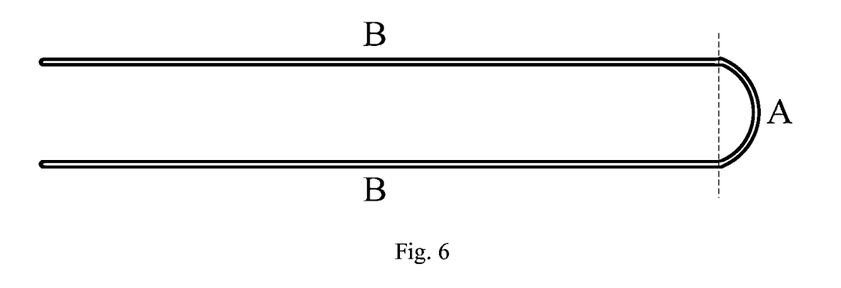
FIG. 6 is an overall cross-sectional diagram of a display panel according to another embodiment of the present disclosure.

In one particular embodiment, as shown in FIGS. 5 and 6, the first display region A may be a curved display region and the second display region B may be a planar display region. In particular, the type of antenna that can be arranged in the display panel may be selected depending on the end product curved surface dimension.

For the user, general display functions are plane-based, the fixed curved portion of the display screen is less utilized, in embodiments of the present disclosure, the fixed curved portion of the display screen is designed as a low resolution area wherein antenna traces are designed between pixel points to effectively utilize the fixed curved portion of the display screen, increase the layout space of the antenna, and address the difficulty of antenna placement difficulties presented by the current oversized screen ratio.

Exemplarily, as shown in FIG. 5, the first display region A includes two portions which are located on two opposite sides of the second display region B. The display panel may be used for a waterfall display screen with a flat display region in the middle and fixed curved display regions on both side borders.

Exemplarily, as shown in FIG. 6, the second display region B includes two portions which are located on two opposite sides of the first display region A and are arranged in parallel. The display panel can be used for a wrap-around display screen with flat display on both sides and fixed curved display on one side frame.

Of course, in the display panel provided herein, the first display region may also be a plane display region, i.e. the antenna may also be located in a plane display region with a low pixel resolution, so that the area on which the antenna can be arranged is large.

In addition, an embodiment of the present disclosure also provides a display device including the display panel according to any one of the above.

In the display device provided by the embodiment of the application, the antenna is integrated in the display area of the display panel, which can reduce the whole machine components, reduce the product structure and improve the assembly yield, and can be specifically applied to mobile phones, PADs, wearable display devices and the like.

It should be noted that in some embodiments of the present disclosure, the display panel and the display device may also include other structures which may depend on actual needs and the embodiments of the present disclosure are not limited thereto. In addition, the embodiments of the present disclosure are only examples of specific embodiments and the inventive aspects of the present disclosure are not limited to the above-described embodiments.

Apparently those skilled in the art may make various modifications and variations to the embodiments of the present disclosure without departing from the spirit and scope of the present disclosure. Thus the present disclosure is intended to include such modifications and variations provided that they fall within the scope of the claims and their equivalents.

What is claimed is:

1. A display panel, comprising:
a first display region and a second display region, wherein a density of pixels of the first display region is lower than a density of pixels of the second display region;
a base substrate and a cover plate, and an antenna arranged between the base substrate and the cover plate, wherein the antenna is arranged in the first display region and among the pixels; and
a first conductive layer and a second conductive layer arranged between the base substrate and the cover plate;
wherein the antenna comprises first wires and second wires;
the first wires are arranged in a same layer as the first conductive layer, and the second wires are arranged in a same layer as the second conductive layer;
the first conductive layer is a gate layer comprising a pattern of gate lines, the first wires extend in an extending direction of the gate lines, and orthogonal projections of the first wires on the base substrate do not overlap orthogonal projections of the gate lines on the base substrate; and
the second conductive layer is a source drain layer comprising a pattern of data lines, the second wires extend along an extending direction of the data lines, and orthogonal projections of the second wires on the base substrate do not overlap orthogonal projections of the data lines on the base substrate.

2. The display panel according to claim 1, further comprising:
an insulating layer arranged between the first conductive layer and the second conductive layer;
wherein the first wires are electrically connected to the second wires through via-holes passing through the insulating layer.

3. The display panel according to claim 1, further comprising a cathode layer arranged between the antenna and the cover plate; and
the cathode layer comprises a first opening arranged in the first display region and is configured to expose at least part of the antenna.

4. The display panel according to claim 3, wherein a shape of the first opening is the same as a shape of the antenna and a projection of the antenna on a plane where the cathode layer is located is within the first opening.

5. The display panel according to claim 1, further comprising a touch electrode layer arranged between the antenna and the cover plate; and
in the first display region, an electrode pattern of the touch electrode layer is configured to avoid a pattern of the antenna.

6. The display panel according to claim 1, wherein a projection of the antenna on the base substrate is a rectangular spiral.

7. The display panel according to claim 1, wherein a ratio of the density of pixels of the first display region to the density of pixels of the second display region is 3/10 to 7/10.

8. The display panel according to claim 1, wherein the first display region is a curved display region and the second display region is a planar display region.

9. The display panel according to claim 8, wherein the first display region comprises two portions arranged on two opposite sides of the second display region.

10. The display panel according to claim 8, wherein the second display region comprises two portions arranged in parallel on two opposite sides of the first display region.

11. A display device, comprising a display panel, wherein the display panel comprises:
a first display region and a second display region, wherein a density of pixels of the first display region is lower than a density of pixels of the second display region;
a base substrate and a cover plate, and an antenna arranged between the base substrate and the cover plate, wherein the antenna is arranged in the first display region and among the pixels; and
a first conductive layer and a second conductive layer arranged between the base substrate and the cover plate;
wherein the antenna comprises first wires and second wires;
the first wires are arranged in a same layer as the first conductive layer, and the second wires are arranged in a same layer as the second conductive layer;
the first conductive layer is a gate layer comprising a pattern of gate lines, the first wires extend in an extending direction of the gate lines, and orthogonal projections of the first wires on the base substrate do not overlap orthogonal projections of the gate lines on the base substrate;
the second conductive layer is a source drain layer comprising a pattern of data lines, the second wires extend along an extending direction of the data lines, and orthogonal projections of the second wires on the base substrate do not overlap orthogonal projections of the data lines on the base substrate.

12. The display device according to claim 11, further comprising:

an insulating layer arranged between the first conductive layer and the second conductive layer;

wherein the first wires are electrically connected to the second wires through via-holes passing through the insulating layer.

\* \* \* \* \*